(12) United States Patent
Sumnitsch

(10) Patent No.: US 6,193,798 B1
(45) Date of Patent: Feb. 27, 2001

(54) ARRANGEMENT FOR TREATMENT OF WAFER-SHAPED ARTICLES, PARTICULARLY SILICON WAFERS

(75) Inventor: Franz Sumnitsch, Klagenfurt (Karnten) (AT)

(73) Assignee: SEZ Semiconductor-Equipment Zubehor fur die Halbleitertertigung AG, Villach (AT)

( * ) Notice: Subject to any disclaimer, the term of this patent is extended or adjusted under 35 U.S.C. 154(b) by 0 days.

(21) Appl. No.: 09/079,455

(22) Filed: May 15, 1998

(30) Foreign Application Priority Data

May 23, 1997 (AT) .......................................... 887/97

(51) Int. Cl.[7] .............................. B05C 5/02; B05C 11/02; B05C 13/02
(52) U.S. Cl. ............................................. 118/52; 427/240
(58) Field of Search ................................. 118/52; 427/240

(56) References Cited

U.S. PATENT DOCUMENTS

| 5,001,084 | 3/1991 | Kawai et al. . | |
|---|---|---|---|
| 5,020,200 | * 6/1991 | Mimasaka et al. | 29/25.1 |
| 5,370,739 | * 12/1994 | Foster et al. | 118/725 |
| 5,416,047 | 5/1995 | Konishi et al. . | |
| 5,487,398 | * 1/1996 | Ohmi et al. | 134/95.1 |
| 5,670,210 | * 9/1997 | Mandal et al. | 427/240 |
| 5,885,353 | * 3/1999 | Strodtbeck et al. | 118/712 |
| 5,932,281 | * 8/1999 | Hochido et al. | 427/126.3 |

FOREIGN PATENT DOCUMENTS

| 0 753 884 | 1/1997 | (EP) . |
|---|---|---|
| WO 96/35227 | 11/1996 | (WO) . |

\* cited by examiner

*Primary Examiner*—Shrive Beck
*Assistant Examiner*—Michael Cleveland
(74) *Attorney, Agent, or Firm*—Young & Thompson

(57) ABSTRACT

In an arrangement for treatment of silicon wafers (4) there is chuck (1) for treatment of silicon wafers (4) which can be caused to turn around its axis (3) via shaft (2). Above the surface of chuck (1) which carries silicon wafer (4) there is hood (5) which does not turn when wafer-shaped article (4) is being treated. Inert gas, preferably nitrogen, is introduced into the interior of hood (12) so that air is displaced from space (12) surrounded by hood (5). In this way formation of spots by oxidation of the silicon comprising the wafer in the presence of water and oxygen is prevented.

3 Claims, 1 Drawing Sheet

ARRANGEMENT FOR TREATMENT OF WAFER-SHAPED ARTICLES, PARTICULARLY SILICON WAFERS

BACKGROUND AND SUMMARY OF THE INVENTION

The invention relates to an arrangement for treatment of wafer-shaped articles, especially silicon wafers, with a chuck for a wafer-shaped article, to which chuck is assigned a drive for turning the chuck around its axis, and with lines for supplying at least one treatment fluid and one flushing fluid.

In certain processes for treatment of wafer-shaped articles, especially (silicon) wafers, especially when flushing the wafers after they have been treated with a treatment medium, for example, with an etching fluid, problems arose in that spots formed on the wafer surface. These spots form because the (silicon) surface of the wafer-shaped article, especially a (silicon) wafer, is oxidized in the presence of water and oxygen.

The object of the invention is to prevent the formation of these "water spots".

This object is achieved with an arrangement described and claimed herein.

Because on the top of the chuck for the wafer-shaped article, for example, a (silicon) wafer, there is a hood which is supplied with an inert gas, for example, nitrogen, air which causes formation of water spots is displaced from the process space directly over the wafer-shaped article.

Because according to one proposal of the invention the hood is made independently of the chuck for the wafer-shaped article, therefore is stationary, a simple construction arises in which the process fluids and inert gas can be easily supplied. The supplied inert gas and supplied treatment fluids in one embodiment of the invention are applied through the hood, the supplied inert gas displacing the undesirable air from the process space.

In the arrangement as claimed in the invention the execution and construction of the chuck are not important for the wafer-shaped article. Any, even known constructions of these chucks can be used.

One advantageous effect of the arrangement as claimed in the invention consists in that in the hood, under the action of the rotating wafer-shaped article, a negative pressure forms which supports the cleaning action and which can be adjusted to the value which is optimum for example for flushing by the amount of feed of inert gas, the rpm of the chuck for the wafer-shaped article, and the width of the gap between the lower edge of the hood and the chuck or the wafer-shaped article.

BRIEF DESCRIPTION OF THE DRAWINGS

Other details, features and advantages of the arrangement as claimed in the invention follow from the following description of two embodiments of the arrangement as claimed in the invention.

DESCRIPTION OF THE PREFERRED EMBODIMENTS

Figure 1:
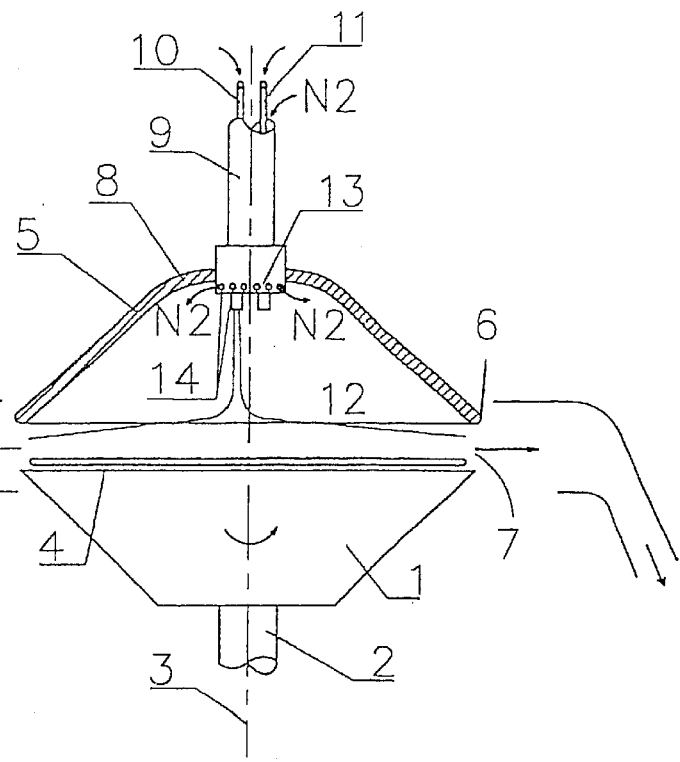
FIG. 1 shows a schematic of a first embodiment in a side view, partially cutaway.

In the embodiment shown in FIG. 1, there is hood 5 which is roughly bell-shaped in the embodiment above chuck 1 which is supported by shaft 2 and which can be turned around its axis 3 by a drive assigned to shaft 2. Bell-shaped hood 5 is located above chuck 1 such that wafer-shaped article 4 held on it, for example, a silicon wafer, is entirely covered by bottom open end 6 of hood 5. Between the arrangement of chuck 1 and wafer 4 (wafer 4 can also have a diameter which is larger than that of chuck 1) on the one hand and bell-shaped hood 5 on the other there is annular gap 7.

In the area of top middle end 8 of hood 5 the latter is joined to hollow support tube 9 through which lines 10 and 11 lead for supply of medium. In particular, in the embodiment shown in FIG. 1 there are at least one line 10 for supplying a treatment fluid and line 11 for supplying a flushing medium, for example, deionized water, both of which in the area of top end 8 of hood 5 discharge in space 12 surrounded by housing 5.

Furthermore, hollow support tube 9 supplies an inert gas, for example, nitrogen, which emerges in the area of upper end 8 of hood 5 through nozzle arrangement 13 into space 12 in hood 5. Nozzles 14 of nozzle arrangement 13 are aligned such that the inert gas from nozzle arrangement 13 emerges roughly radially and fills entire space 12 uniformly with inert gas to displace air from space 12.

Figure 2:
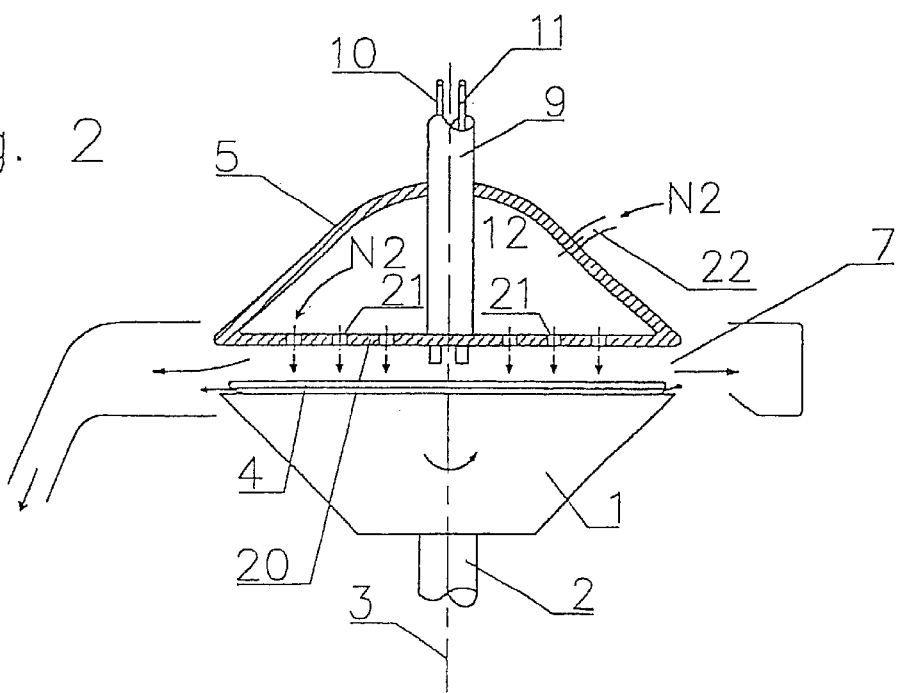
FIG. 2 shows another embodiment, partially cutaway.

The embodiment of the arrangement as claimed in the invention shown in FIG. 2 differs from the one shown in FIG. 1 preferably in that bottom end 6 of hood 5 is sealed by wall 20. In wall 20 there are several holes 21 which are aligned essentially parallel, for example, to axis 3, and which are located distributed over the surface of wall 20. Furthermore, in the embodiment shown in FIG. 2, support tube 9 for hood 5 is lengthened as far as wall 20. Lines 10 and 11 discharge on the side of wall 20 facing article 4 and chuck 1. Thus treatment fluids will emerge in the vicinity of wafer-shaped article 4 and are applied centrally thereto. To the side wall of hood 5 line 22 is connected through which an inert gas (for example, nitrogen) can be introduced into space 12 within hood 5. The inert gas introduced into space 12 emerges distributed uniformly over the entire surface of article 4 through openings 21 and results in air being displaced from the space between wall 20 and article 4 so that there is an inert gas atmosphere there.

In both embodiments of the arrangement as claimed in the invention, hood 5 is stationary and only chuck 1 turns with article 4 held thereon.

To facilitate placement of wafer-shaped article 4 on chuck 1 and removal of wafer 4 from chuck 1, hood 5 can be moved away from its action position which has approached chuck 1 (FIGS. 1 and 2).

As shown in FIGS. 1 and 2, in a preferred embodiment of the present invention an entirety of a peripheral edge (bottom edge 6) of the hood 5 is spaced from the carrier (chuck 1) to define a peripheral opening to an exterior of the hood between the peripheral edge the carrier for escape of a gas from the interior space 12 and for discharge of a fluid. The entirety of the peripheral edge of the hood is directly over a peripheral edge of the carrier (i.e., there is no intervening structure) and generally coextensive with the peripheral edge of the carrier.

In summary, one preferred embodiment of the arrangement as claimed in the invention for treatment of wafer-shaped articles, especially silicon wafers, can be described as follows:

In an arrangement for treatment of silicon wafers 4 there is chuck 1 for treatment of silicon wafers 4 which can be caused to rotate around its axis 3 via shaft 2. Above the surface of chuck 1 which carries silicon wafer 4 there is hood 5 which does not turn when wafer-shaped article 4 is being treated. Inert gas, preferably nitrogen, is introduced into the interior of hood 12 so that air is displaced from space 12 surrounded by hood 5. In this way formation of spots by oxidation of the silicon comprising the wafer in the presence of water and oxygen is prevented.

What is claimed is:

1. A device for treating a wafer-shaped article, comprising:

a rotatable carrier having a portion for holding a wafer-shaped article;

a hood defining an interior space above said carrier for holding an inert gas, said hood having a peripheral edge adjacent to said carrier that has a diameter at least as great as a diameter of the portion of said carrier for holding a wafer-shaped article so that said hood completely overlaps the portion;

an inert gas inlet into said hood for supplying an inert gas to said interior space of said hood;

a fluid inlet over said carrier for supplying a fluid to the portion of said carrier for holding a wafer-shaped article; and a hollow tube that supports said hood and from which said fluid inlet emerges, said inert gas inlet comprising openings in said hollow tube that are separate from said fluid inlet and that are aligned so that inert gas emerges generally radially from said openings, an entirety of said peripheral edge of said hood being spaced from said carrier to define a peripheral opening to an exterior of said hood between said peripheral edge and said carrier for escape of a gas from said interior space and for discharge of a fluid, wherein the entirety of said peripheral edge of said hood is directly over and coextensive with a peripheral edge of said carrier.

2. The device of claim 1, wherein said hood is coaxial with said carrier.

3. A device for treating a wafer-shaped article, comprising:

a rotatable carrier having a portion for holding a wafer-shaped article;

a hood defining an interior space above said carrier for holding an inert gas, said hood having a peripheral edge adjacent to said carrier that has a diameter at least as great as a diameter of the portion of said carrier for holding a wafer-shaped article so that said hood completely overlaps the portion;

a perforated plate that separates said interior space from said carrier;

an inert gas inlet into said hood for supplying an inert gas to said interior space of said hood;

a fluid inlet over said carrier for supplying a fluid to the portion of said carrier for holding a wafer-shaped article; and a hollow tube that supports said hood and that extends to said plate, and wherein said inert gas inlet is interior to said interior space and said fluid inlet is exterior to said interior spaces, an entirety of said peripheral edge of said hood being spaced from said carrier to define a peripheral opening to an exterior of said hood between said peripheral edge and said carrier for escape of a gas from said interior space and for discharge of a fluid, wherein the entirety of said peripheral edge of said hood is directly over and coextensive with a peripheral edge of said carrier.

* * * * *